United States Patent
Kinzer et al.

(10) Patent No.: US 7,465,997 B2
(45) Date of Patent: Dec. 16, 2008

(54) III-NITRIDE BIDIRECTIONAL SWITCH

(75) Inventors: Daniel M. Kinzer, El Segundo, CA (US); Robert Beach, Altadena, CA (US)

(73) Assignee: International Rectifier Corporation, El Segundo, CA (US)

( * ) Notice: Subject to any disclaimer, the term of this patent is extended or adjusted under 35 U.S.C. 154(b) by 0 days.

(21) Appl. No.: 11/056,062

(22) Filed: Feb. 11, 2005

(65) Prior Publication Data

US 2005/0189561 A1  Sep. 1, 2005

Related U.S. Application Data

(60) Provisional application No. 60/544,626, filed on Feb. 12, 2004.

(51) Int. Cl.
*H01L 27/088* (2006.01)
(52) U.S. Cl. .................. 257/401; 257/192; 257/194; 257/200; 257/201
(58) Field of Classification Search ........... 257/194, 257/192, E29.246–E29.254, 200–201, 401
See application file for complete search history.

(56) References Cited

U.S. PATENT DOCUMENTS

| | | | |
|---|---|---|---|
| 4,424,525 A * | 1/1984 | Mimura | 257/194 |
| 4,511,813 A * | 4/1985 | Pan | 327/431 |
| 5,387,880 A | 2/1995 | Kobayashi | |
| 5,808,332 A * | 9/1998 | Kohno et al. | 257/280 |
| 6,177,685 B1 * | 1/2001 | Teraguchi et al. | 257/20 |
| 6,329,677 B1 * | 12/2001 | Oguri et al. | 257/194 |
| 6,465,814 B2 * | 10/2002 | Kasahara et al. | 257/192 |
| 6,492,669 B2 * | 12/2002 | Nakayama et al. | 257/282 |
| 6,690,042 B2 * | 2/2004 | Khan et al. | 257/192 |
| 2001/0023964 A1 * | 9/2001 | Wu et al. | 257/368 |
| 2002/0041003 A1 | 4/2002 | Udrea et al. | |
| 2002/0139995 A1 * | 10/2002 | Inoue et al. | 257/194 |
| 2002/0167023 A1 * | 11/2002 | Chavarkar et al. | 257/194 |
| 2002/0171405 A1 | 11/2002 | Watanabe | |
| 2006/0060871 A1 * | 3/2006 | Beach | 257/94 |

OTHER PUBLICATIONS

NG, Kwok K. Complete Guide to Semiconductor Devices. John Wiley and Sons, Inc., New York. (2002) p. 176.*
International Search Report mailed Feb. 14, 2006 from PCT Application No. PCT/US05/04388.
High Transconductance Heterostructure Field-effect Transistors Based on AlGaN/GaN—Chen, Khan, Yang, Sun, Shur, Park—Appl. Phys. Lett. 69 (6) Aug. 5, 1996 American Institute of Physics—pp. 794-796.
Reduction of Gate Current in AlSb/InAs HEMTs Using a Dual-gate Design—Boos, Kruppa, Park—Electronics Letters Aug. 15th, 1996, vol. 32 No. 17—pp. 1624-1625.
Emerging Gallium Nitride Based Devices—Mohammad, Salvador, Morkoc—Proceedings of the IEEE, vol. 83, No. 10, Oct. 1995—pp. 1306-1355.

(Continued)

*Primary Examiner*—Allan R. Wilson
(74) *Attorney, Agent, or Firm*—Ostrolenk, Faber, Gerb & Soffen, LLP

(57) ABSTRACT

A III-nitride bidirectional switch which includes an AlGaN/GaN interface that obtains a high current currying channel. The bidirectional switch operates with at least one gate that prevents or permits the establishment of a two dimensional electron gas to form the current carrying channel for the bidirectional switch.

13 Claims, 8 Drawing Sheets

OTHER PUBLICATIONS

Enhancement and Depletion Mode GaN/AlGaN Heterostructure Field Effect Transistors—Khan, Chen, Sun, Yang, Blasingame, Shur and Park—1996 American Institute of Physics—pp. 514-516.

High Transconductance Enhancement-Mode AlGaN/GaN HEMTs on SiC Substrate—Kumar, Kuliev, Tanaka, Otoki and Adesida—Electronics Letters Nov. 27th, 2003, vol. 39 No. 24.

AlGaN/GaN HEMTs on SiC with $f_T$ of Over 120 GHz—Kumar, Lu, Schwindt, Kuliev, Simin, Yang, Khan and Adesida—Fellow, IEEE—IEEE Electron Device Letters, vol. 23, No. 8 Aug. 2002.

Taiwanese Office Action dated Sep. 5, 2007 in the corresponding Taiwanese Patent Application.

* cited by examiner

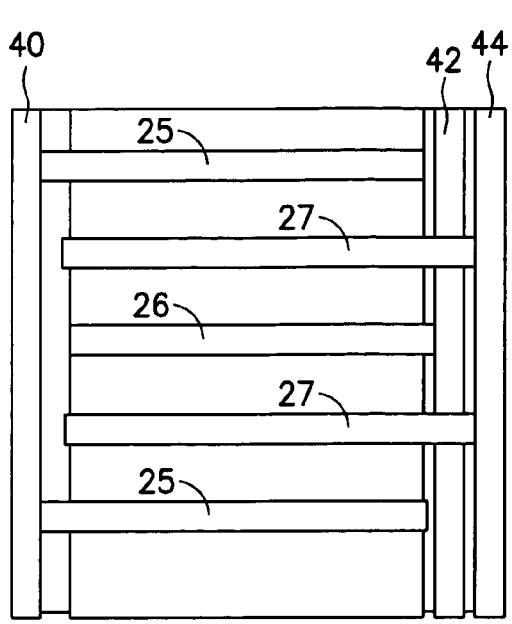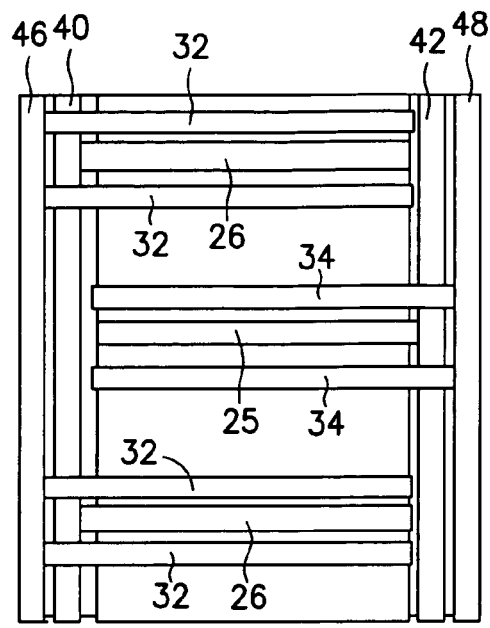
Figure 5    Figure 6
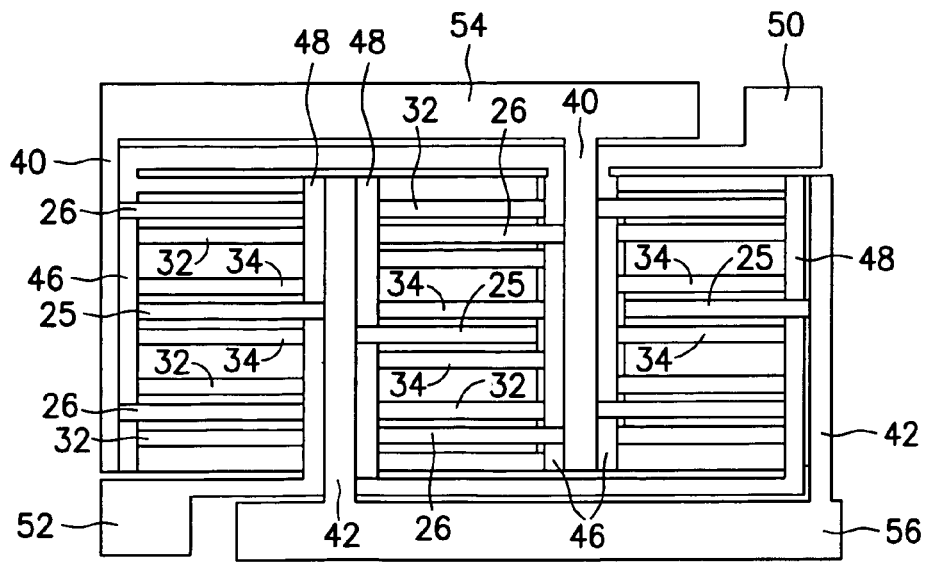
Figure 7

III-NITRIDE BIDIRECTIONAL SWITCH

CROSS-REFERENCE TO RELATED APPLICATION

The present application is based on and claims benefit of U.S. Provisional Application No. 60/544,626 filed Feb. 12, 2004, entitled III-NITRIDE BIDIRECTIONAL SWITCH, to which a claim of priority is hereby made and the disclosure of which is hereby incorporated by this reference.

BACKGROUND OF THE INVENTION

1. Field of the Invention

The present invention relates generally to semiconductor switches, and relates more particularly to bidirectional semiconductor switches produced in a III-Nitride material system.

2. Description of Related Art

Development of devices based on III-nitride materials has generally been aimed at high power-high frequency applications such as emitters for cell phone base stations. The devices fabricated for these types of applications are based on general device structures that exhibit high electron mobility and are referred to variously as heterojunction field effect transistors (HFETs), high electron mobility transistors (HEMTs) or modulation doped field effect transistors (MODFETs). These types of devices are typically able to withstand high voltages in the range of 100 Volts or higher, while operating at high frequencies, typically in the range of 2-100 GHz. These types of devices may be modified for a number of types of applications, but typically operate through the use of piezoelectric polarization to generate a two dimensional electron gas (2DEG) that allows transport of very high currents with very low resistive losses. A typical HEMT includes a substrate, which is formed from sapphire, silicon, or SiC, a GaN layer formed over the substrate, an AlGaN layer formed over the GaN layer, two spaced ohmic electrodes and a gate electrode formed therebetween on the AlGaN layer. Thus, a typical HEMT is a planar device meaning that current between its two power electrodes travels in a lateral direction.

The specific on resistance of a planar HEMT that exhibits, for example, a 300V breakdown voltage is approximately $1/100$ that of a silicon-based device with a vertical geometry of the same voltage rating. Thus, a planar HEMT is a good candidate for power applications. However, these conventional devices block voltage only in one direction.

Due to a strong need for more efficient circuit topologies in applications such as PDP and PFC, it is desirable to have a bidirectional semiconductor device that is capable of high current, low on resistance and high voltage applications in order to reduce the number of devices.

SUMMARY OF THE INVENTION

A semiconductor switch according to the present invention is bidrectional and thus blocks voltage in both directions. This symmetry with respect to voltage blocking capability is achieved without sacrificing wafer material and, therefore, allows for cost reduction as well.

Furthermore, in contrast to conventional designs that block voltage in one direction, a bidirectional switch according to the present invention can replace four unidirectional switches for the same overall resistance.

A bidirectional semiconductor switch according to one variation of the present invention includes two ohmic electrodes and a gate electrode so positioned between the two ohmic electrodes in order to achieve a symmetric voltage blocking capability. Thus, in one preferred embodiment the gate electrode is formed in a position that is equally spaced from the first ohmic electrode and the second ohmic electrode.

In another variation, a bidirectional switch according to the present invention includes two gate electrodes disposed between two ohmic electrodes. In this embodiment, each gate electrode is spaced from a respective ohmic electrode by the same distance. The use of two gate electrodes is advantageous in that it allows the voltage standoff region to be shared, thereby allowing for the reduction of the wafer area required for the transistor.

Other features and advantages of the present invention will become apparent from the following description of the invention which refers to the accompanying drawings.

BRIEF DESCRIPTION OF THE DRAWINGS

FIG. 5 is a plan view of a single gated bi-directional switch in accordance with the present invention.

FIG. 6 is a plan view of a dual gated bi-directional switch in accordance with the present invention.

FIG. 7 is a plan view of a dual gated bi-directional switch structure in accordance with the present invention.

DETAILED DESCRIPTION OF THE PREFERRED EMBODIMENTS

Figure 1:
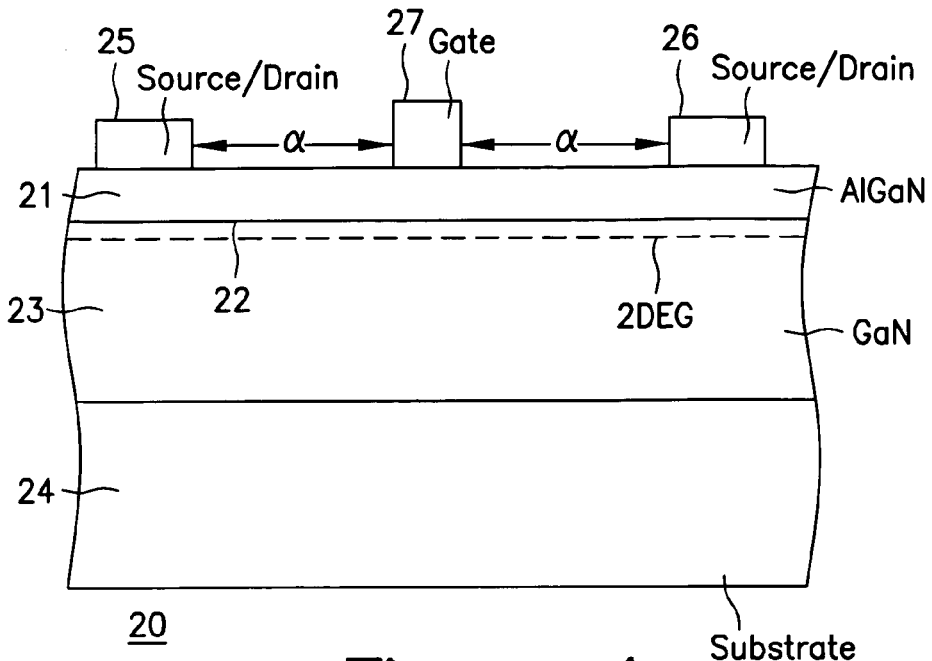
FIG. 1 is a III-nitride nominally on bi-directional switch element in accordance with the present invention.

Referring now to FIG. 1, a bi-directional III-nitride switch according to the first embodiment of the present invention is illustrated generally as a device structure 20. Device 20 includes substrate 24, which may be composed of Si, SiC, Sapphire, or the like, a first semiconductor body 23 formed over substrate 24 comprised of one III-nitride material, and a second semiconductor body 21 formed over first semiconductor body 23 and composed of another III-nitride semiconductor material having a band gap that is different from the one semiconductor material. It should be noted that first semiconductor body 23 need not be directly formed over substrate 24, but that a bottom layer may be interposed therebetween without deviating from the present invention. In the preferred embodiment, the one III-nitride semiconductor material is GaN and the another semiconductor material is AlGaN. As is known, the heterojunction 22 of GaN and AlGaN produces a highly conductive two-dimensional electron gas (2DEG) at or near heterojunction 22. The 2DEG is formed due to the spontaneous polarization effect as is known in the field.

Device 20 further includes ohmic power electrodes 25, 26 which are ohmically connected to second semiconductor body 21, and gate electrode 27 which is disposed between ohmic electrodes 25, 26. Ohmic electrodes may be formed from any suitable metal such as gold, silver, aluminum, titanium, or indium, any suitable metal stack of different metals, or non-metallic material such as a heavily doped semiconductor (P or N type) polysilicon or metal silicides.

In the preferred embodiment, gate electrode 27 makes a schottky contact with second semiconductor body 21, and may be composed of metallic material such as titanium, gold, aluminum, silver, chromium, tungsten, platinum, nickel, palladium, or indium, a metallic stack of different metals, or a non-metallic material such as a doped semiconductor (P or N type depending on the desired threshold voltage), polysilicon, or metal silicide. A device according to the present invention is not limited to a schottky gate, but may include instead a gate which is comprised of a gate electrode, and a gate insulator such as SiN, $Al_2O_3$, SiO2 or the like interposed between the gate electrode and second semiconductor body 21.

Device 20 according to the first embodiment is a depletion mode device, i.e., a device that is nominally on. The application of a suitable voltage to gate electrode 27 acts to interrupt the 2DEG to turn device 20 off giving device 20 its power switching capability.

According to the present invention, gate electrode 27 is disposed between ohmic electrodes 25, 26 and positioned such that device exhibits a symmetric voltage blocking capability. That is, device 20 is capable of blocking the same voltage regardless of which ohmic electrode 25, 26 is at a higher potential.

According to an aspect of the present invention, to achieve a symmetric voltage blocking capability, gate electrode 27 is spaced an equal distance $\alpha$ from ohmic electrode 25 and ohmic electrode 26 (i.e. in a central position with respect to ohmic electrodes 25, 26). It should, however, be noted that gate electrode 27 need not be centrally located, but can be offset from the center position to compensate for spurious fields from substrate 24, and still achieve the symmetric voltage blocking capability that is desired.

Device 20 is capable of carrying large amounts of current from/to ohmic electrodes 25, 26 due to the 2DEG near heterojunction 22. Typically, the electrical potential applied to gate electrode 27 will be a negative potential that is more negative than any potential applied to ohmic electrodes 25, 26. It should be noted that due to its symmetric voltage blocking capability, either ohmic electrode 25, 26 can serve as a drain or a source.

Figure 2:
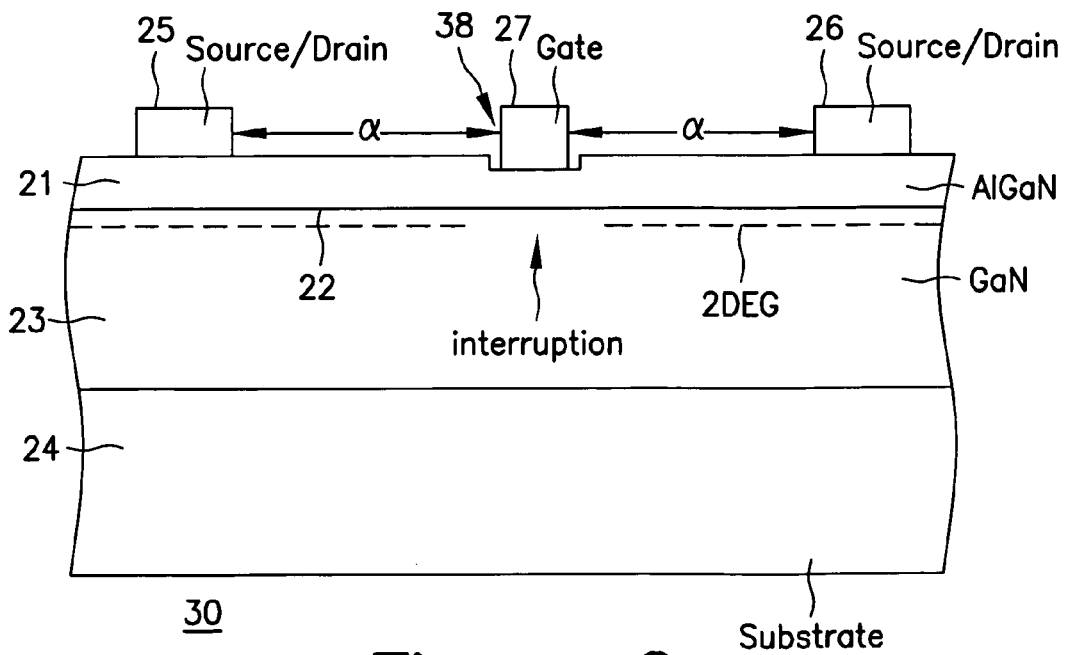
FIG. 2 is a nominally off III-nitride bi-directional switch element in accordance with the present invention.

Referring now to FIG. 2, in which like numerals identify like features, device 30 according to the present invention includes all of the features of device 20 according to the first embodiment except that gate electrode 27 in device 30 is disposed within recess 38 formed in second semiconductor layer 21. As a result, device 30, according to the second embodiment of the present invention is an enhancement mode device; i.e., it is a nominally off device. Specifically, recess 38 causes an interruption in the 2DEG, which can be restored upon application of an appropriate voltage to gate electrode 27. The principles of the operation of an enhancement mode device in a III-nitride heterojunction device is explained in U.S. application Ser. No. 11/040,657, entitled Enhancement Mode III-Nitride FET, filed on Jan. 21, 2005, in the name of Robert Beach, and assigned to the assignee of the present application, the contents of which are incorporated by reference.

Gate electrode 27 in device 30 preferably makes schottky contact to second semiconductor layer 21 at the bottom of recess 38. Gate electrode 27, however, may be replaced with a gate conductor and a gate insulator disposed between gate conductor and second semiconductor body 21 without deviating from the present invention. Furthermore, according to the present invention gate electrode 27 in device 30 is positioned in order to achieve symmetry in voltage blocking capability. In the preferred embodiment, gate electrode 27 in device 30 is spaced an equal distance $\alpha$ from ohmic electrode 25 and ohmic electrode 26, i.e. centrally located with respect to the two ohmic electrodes, in order to achieve symmetry.

Figure 3:
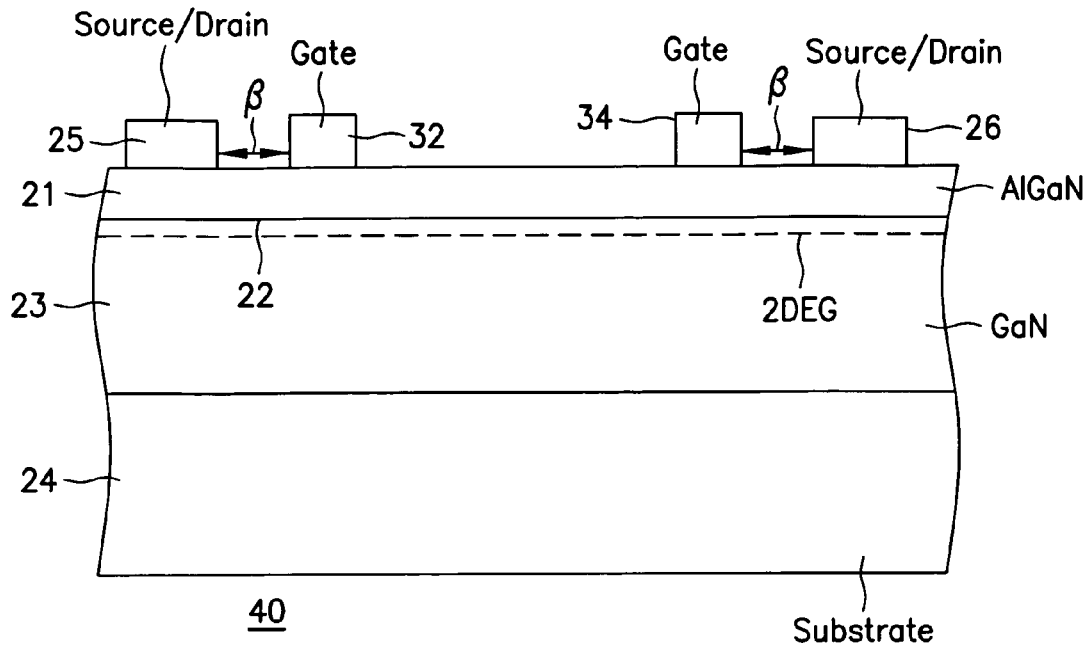
FIG. 3 is a dual gated nominally on III-nitride bi-directional switch element in accordance with the present invention.

Referring now to FIG. 3, in which like numerals identify like features, device 40 according to the third embodiment of the present invention includes two gate electrodes, first gate electrode 32 and second gate electrode 34. First gate electrode 32 is nearest to first ohmic electrode 25 and spaced from the same by a distance $\beta$. Second gate electrode 34 is nearest second ohmic electrode 26 and spaced from the same by a distance $\beta$ as well. That is, first gate electrode 32 is spaced the same distance from first ohmic electrode 25 as second gate electrode 34 is from second ohmic electrode 26.

Device 40, according to the third embodiment is also a depletion mode device, meaning that it is nominally on. Specifically, the application of an appropriate voltage to either gate electrode 32, 34 causes an interruption in the 2DEG, whereby device 40 is turned off.

According to one aspect of the present invention, first gate electrode 32 and second gate electrode 34 are independently operable, meaning that each gate electrode receives a voltage pulse from a respective gate pad (shown later). Due to the fact that the distance $\beta$ between each gate electrode 32, 34 and a nearest ohmic electrode 25, 26 is the same, device 40 is also symmetric. That is, device 40 exhibits the same voltage blocking characteristic regardless of which ohmic electrode is at a higher potential.

Gate electrodes 32, 34 in the preferred embodiment make schottky contacts with second semiconductor body 21. However, gate contacts 32, 34 may be replaced with an insulated gate that includes a gate electrode, and a gate insulator interposed between the gate electrode and second semiconductor body 21 without deviating from the present invention.

Device 40 is a bi-directional switch that functions as two switches in one location. Each gate electrode 32, 34 in device 40 can operate independently to turn the device ON/OFF. Accordingly, device 40 can be made to operate like a NOR gate, in which when any one of the two gate electrodes 32, 34 is active the device is off. If either or both of gate electrodes 32, 34 have an electrical potential applied to cause a switching event, the channel between source/drain electrodes 45, 46 is interrupted.

Device 40 includes a shared drift region to improve the conduction capabilities of the device, while increasing the functionality through the use of the dual gate structure. Referring for a moment to FIGS. 1 and 2, the single gate device has two drift regions in series with each other. Therefore, a device according to the present invention which includes a single gate electrode 27 requires twice as much semiconductor material. On the other hand, by providing a shared drift region in the dual gate structure of device 40, the device area is reduced nearly in half and the device has additional functionality due to the two separate channels with the two separate gate electrodes. In device 40, each gate electrode 47, 48 is referenced to the nearby ohmic electrode 25, 26. Specifically, for a given blocking voltage, the separation between the gate edge and the drain is the relevant factor. Thus, in a single gate device the separation from source to drain is 2A+width of the gate, where A is the distance between the edge of the gate and the source or the drain. For a dual-gated device the length A is between the two gates to withstand the voltage, and the total length for the device is A+2 gate widths+2 gate to drain/source spaces. The length A is the largest space and only occurs once in a dual-gated design.

Figure 4:
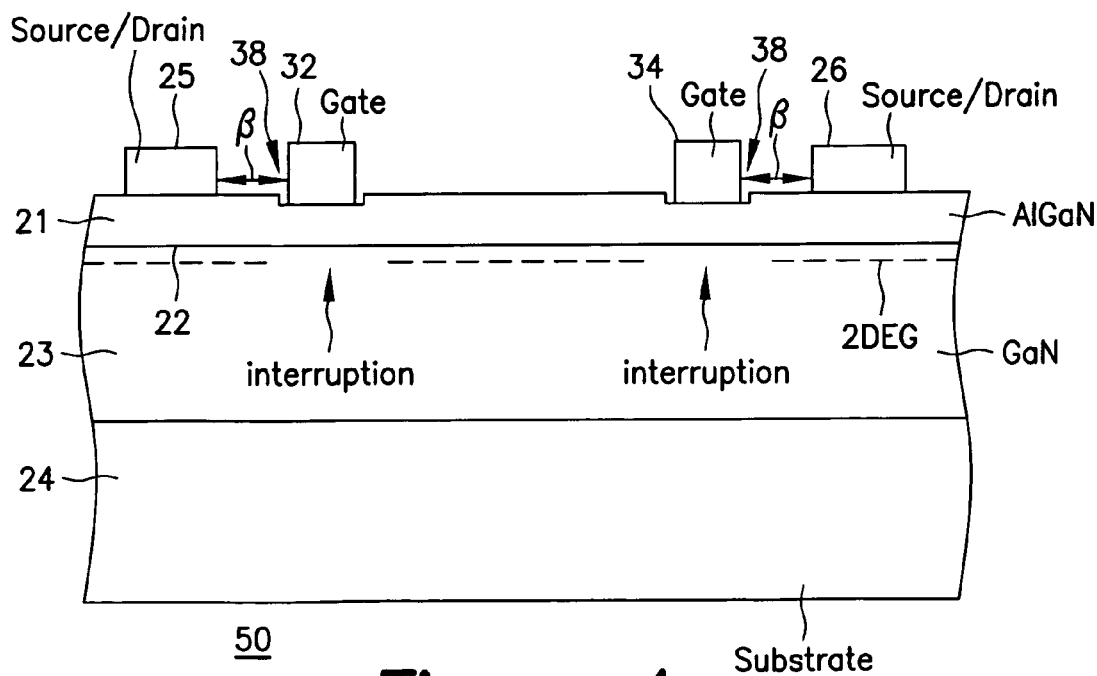
FIG. 4 is a dual gated nominally off III-nitride bi-directional switch element in accordance with the present invention.

Referring to FIG. 4, in which like numerals identify like features, a device 50 according to the fourth embodiment of the present invention is an enhancement mode device, which means that it is nominally off. Similar to the second embodiment, device 50 includes gate electrodes 32, 34, each of which is disposed within a respective recess 38 in second semiconductor body 21. Each recess 38 causes an interruption in the 2DEG, which can be restored upon application of a suitable voltage to gate electrodes 32, 34.

Accordingly, device 50 acts like a power logic AND gate, in which current flows to/from electrodes 25, 26 when both gate electrodes 32, 34 have a potential applied to them.

Because of the shared drift region used by the two channels controlled through gate electrodes 32, 34 device 50 can be made smaller than device 30.

Similar to device 40, first gate electrode 32 is a distance β from first ohmic electrode 25, and second gate electrode 34 is the same distance β from second ohmic electrode 26, whereby device 50 is rendered symmetric. That is, the voltage blocking capability of the device is the same regardless of which ohmic electrode is at the higher potential.

Furthermore, similar to the third embodiment, each gate electrode 32, 34 is independently operable.

Similar to the other three embodiments, gate electrodes 32, 34 preferably make schottky contacts with second semiconductor body 21, but can be replaced with insulated gates that include a gate electrode and a gate insulator without deviating from the present invention.

Referring to FIG. 5, a device according to either the first embodiment or the second embodiment is preferably arranged to have interdigitated ohmic electrodes 25, 26. Specifically, a device according to the preferred embodiment includes two opposing and preferably parallel runners 40, 42. Each runner 40, 42 is electrically connected with one of the two ohmic electrode 25, 26. Thus, runner 40 is electrically connected to first ohmic electrodes 25, and runner 42 is electrically connected to second ohmic electrodes 26. It should be noted that ohmic electrodes 25, 26 are arranged parallel to one another whereby an interdigitated arrangement is achieved. Each gate electrodes 27 is disposed between an opposing pair of first and second ohmic electrodes 25, 26. It should be noted that a gate runner 44 is also provided to electrically connect gate electrodes 27 to one another.

Referring next to FIG. 6, in which like numerals identify like features, a device according to either the third or the fourth embodiment of the present invention includes two gate runners 46, 48. Each gate runner 46, 48 is electrically connected only to one of the gate electrodes 32, 34.

Referring to FIG. 7, in a device according to either the third or the fourth embodiment, each gate runner 46, 48 is electrically connected to a respective gate pad 50, 52, whereby each one of the gate electrodes 32, 34 becomes capable of independent operation. Also, it should be noted that all runners 40 connected to first ohmic electrode 25 are electrically connected to a respective common pad 54, and all runners 42 connected to second ohmic electrodes 26 are electrically connected to a respective common pad 56.

Figure 8:
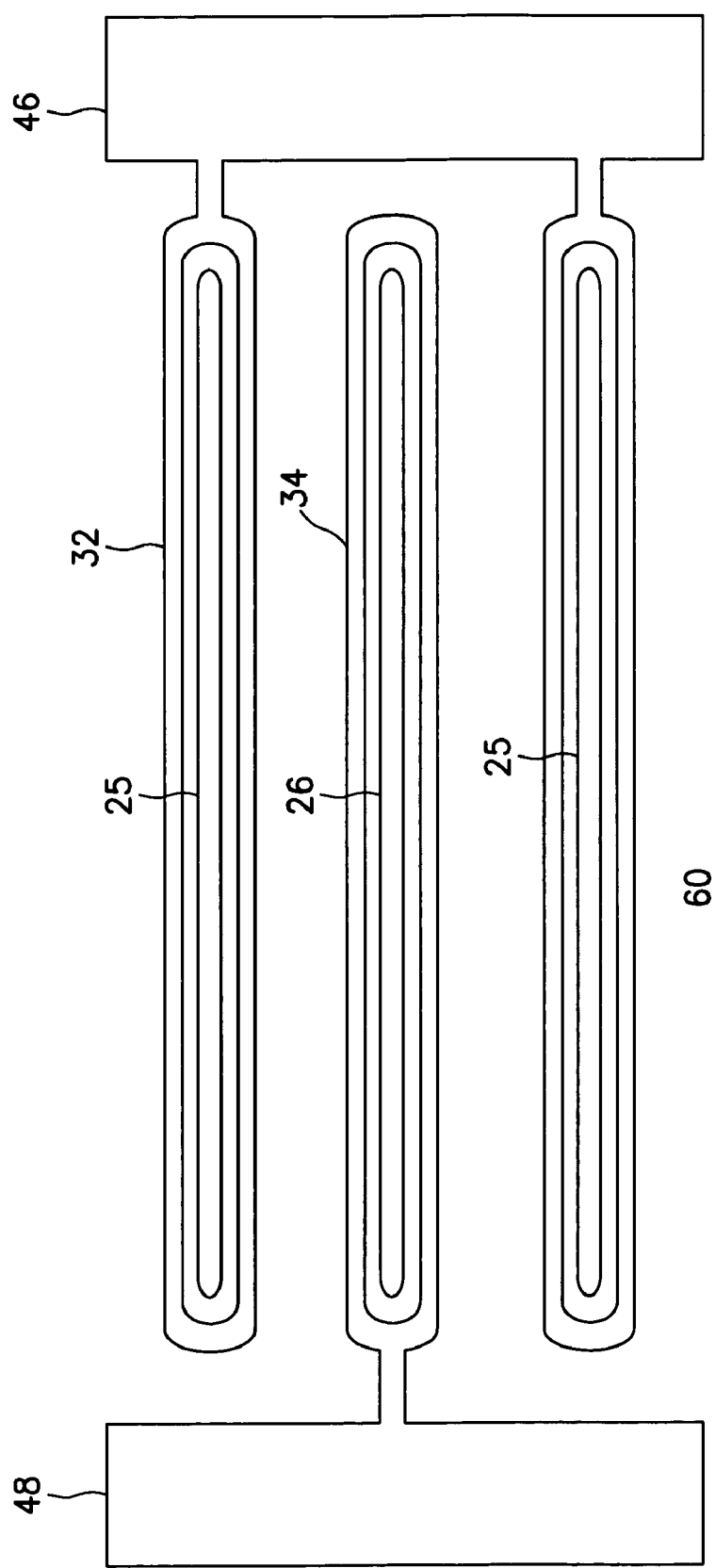
FIG. 8 is a plan view of a gate structure for a bi-directional switch in accordance with the present invention.

Referring now to FIG. 8, an alternate arrangement for gate electrodes and ohmic electrode 26, 25 is illustrated as structure 60. Structure 90 includes two gate electrodes, gate electrodes 32, 34. Gate electrodes 32, 34 are provided without insulation and are formed to have a smooth rounded edges to prevent crowding of the electric fields. Gate electrodes 32, 34 can be formed without the need for implant operations, thereby reducing damage to the structure that can potentially decrease the breakdown resistance of the device. Device 60 is formed with fewer etching operations to reduce the amount of material that is removed. Accordingly, the volume of conductive pathways for carriers through the material is increased, which in turn lowers the overall resistance of device 90.

Figure 9:
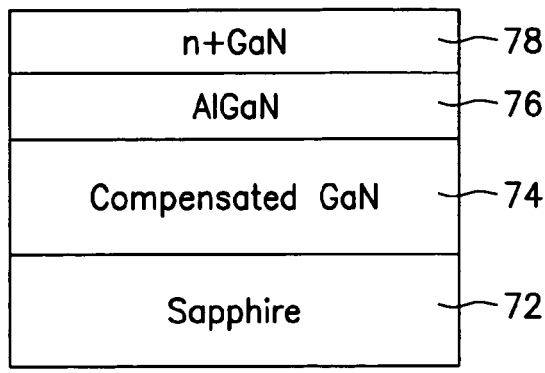
FIGS. 9-18 illustrate a process for fabricating a device according to the present invention.

Referring now to FIGS. 9-18, an example of a process for fabrication of a single gate bidirectional switch in the III-nitride material system is illustrated. Although a single gate device is illustrated, it should be apparent that the process is equally applicable to the construction of a dual gate device. Referring to FIG. 9, the process commences with a prepared GaN wafer that can be obtained through known methods. Wafer 70 includes a substrate 72 composed of sapphire, a compensated GaN layer 74 disposed on substrate 72, an AlGaN layer 76 over the compensated GaN layer 74 and finally a doped GaN layer 78 overlaying AlGaN layer 76. Wafer 70 is constructed to compensate for strain to prevent dislocations and cracking in compensated GaN layer 74.

Figure 10:
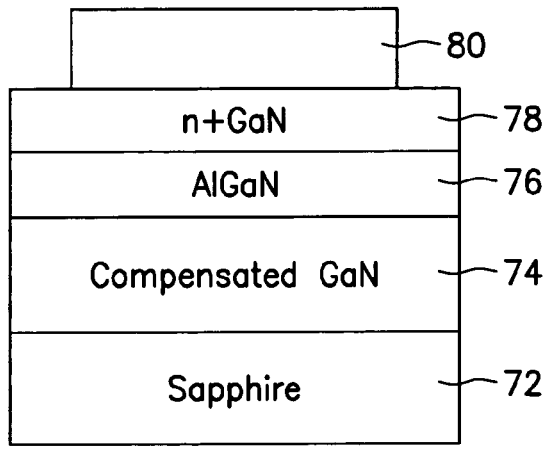
Figure 11:
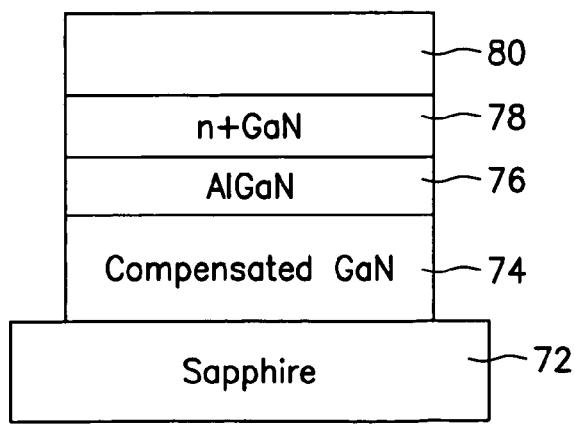
Figure 12:
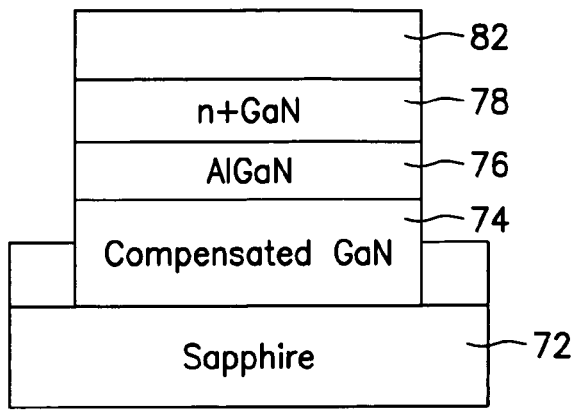

Referring now to FIG. 10, wafer 70 has a mask layered 80 deposited thereon to define an active region. Referring to FIG. 11, wafer 70 is etched down to substrate 72. After mask 80 is stripped, a metal layer 82 is deposited over doped GaN layer 78. Metal layer 82 may be composed of an ohmic metal alloy, such as Ti/Al/TiW, for example. Device 160 is then annealed, for example at 850° C. for one minute.

Figure 13:
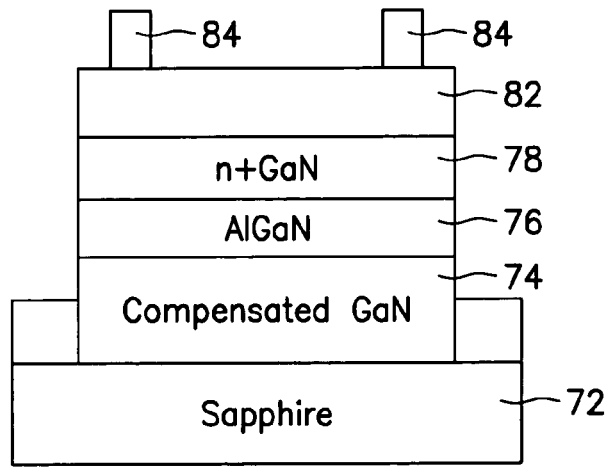
Figure 14:
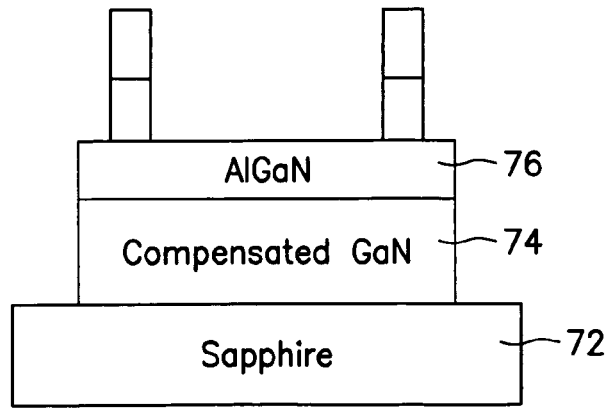

Referring now to FIG. 13, ohmic electrodes are patterned with mask portions 84 and an etch is performed to remove the exposed metal and doped GaN layers after which the mask is removed resulting in the structure of FIG. 14.

Figures 15, 16:
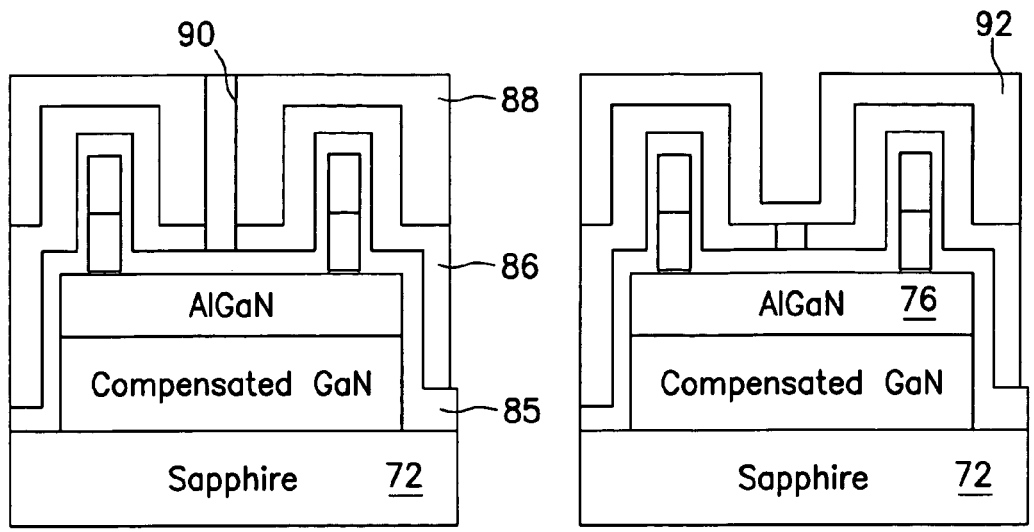
Figures 17, 18:
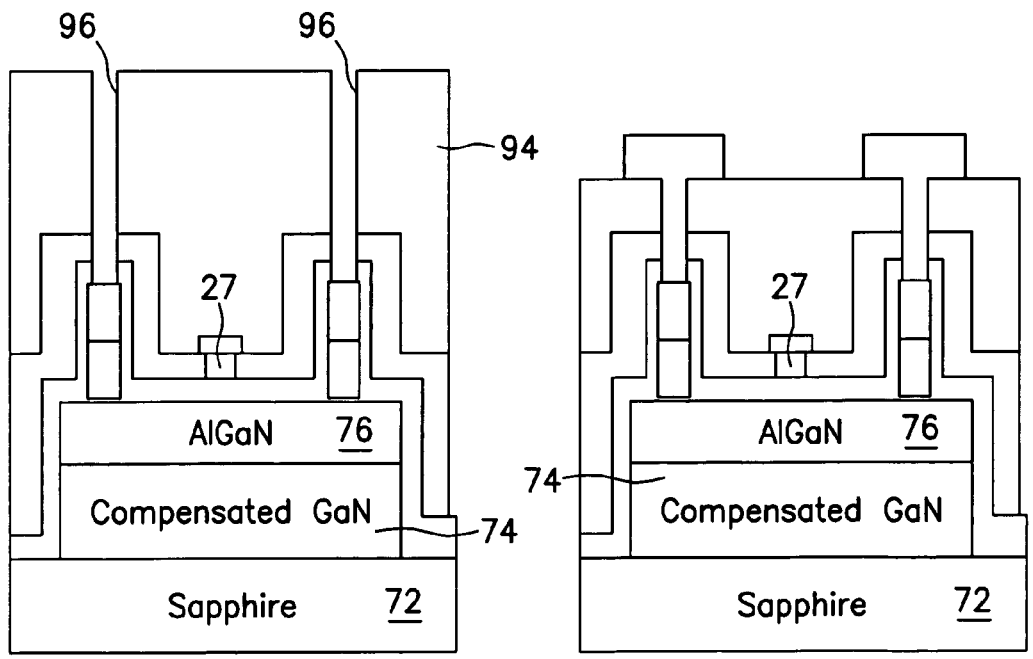

Referring next to FIG. 15, a layer of SiN 85, and a layer of $SiO_2$ 86 are deposited over the structure shown in FIG. 14. Thereafter, a mask 88 is formed which includes window 90 to define the region which is to receive a gate electrode. Window 90 is used to etch away a portion of the $SiO_2$ layer 86, leaving behind a thin portion of the SiN 85 (e.g. about 200 Å). Mask 88 is then stripped and gate metal 92, such as TiW is deposited to result in the structure shown in FIG. 16. Next, gate metal 92 is etched to leave gate electrode 27 in place. Referring next to FIG. 17, an insulation layer 94 is formed, and etched to include openings 96 therein over the ohmic electrodes. Then, contact metal is deposited to fill openings 96 and make contact with the ohmic electrodes. Thereafter, the deposited contact metal is etched to form contacts 98 as seen in FIG. 18.

It should be apparent that the above described process for forming a single gate bidirectional III-nitride switch is equally applicable to forming a dual bidirectional III-nitride switch. It should also be apparent that a number of devices maybe formed in a single wafer to form a number of useful components for a given application. For example, a number of useful devices may be connected to together to form a larger bidirection switching device capable of carrying high amounts of current. Alternately, a number of so formed high current devices may be connected to form a bidirectional 3 phase bridge, a bidirectional full bridge or a bidirectional half bridge. In addition, variations on the device may be realized to form such useful devices as a Schottky bridge or a bidirectional half bridge with a common drain node. Each of the above devices is capable of carrying large amounts of current in a smaller area then that possible with conventional semiconductor devices. Because of the greater capability of the III-nitride devices the bidirectional switches may be made smaller and still perform as well larger conventional devices.

The bi-directional switch of the present invention can also be formed using other known techniques for construction of III-nitride devices including the interposition of super lattice layer structures and varying alloy layers, including InAlGaN with particular qualities to balance and in-plane lattice structure constant for example. Thus, although the preferred embodiments shown herein include a layer of AlGaN formed over GaN, the present invention is not restricted to such a combination. For example, an AlGaN/InGaN/GaN can be used without deviating from the present invention.

Figure 19:
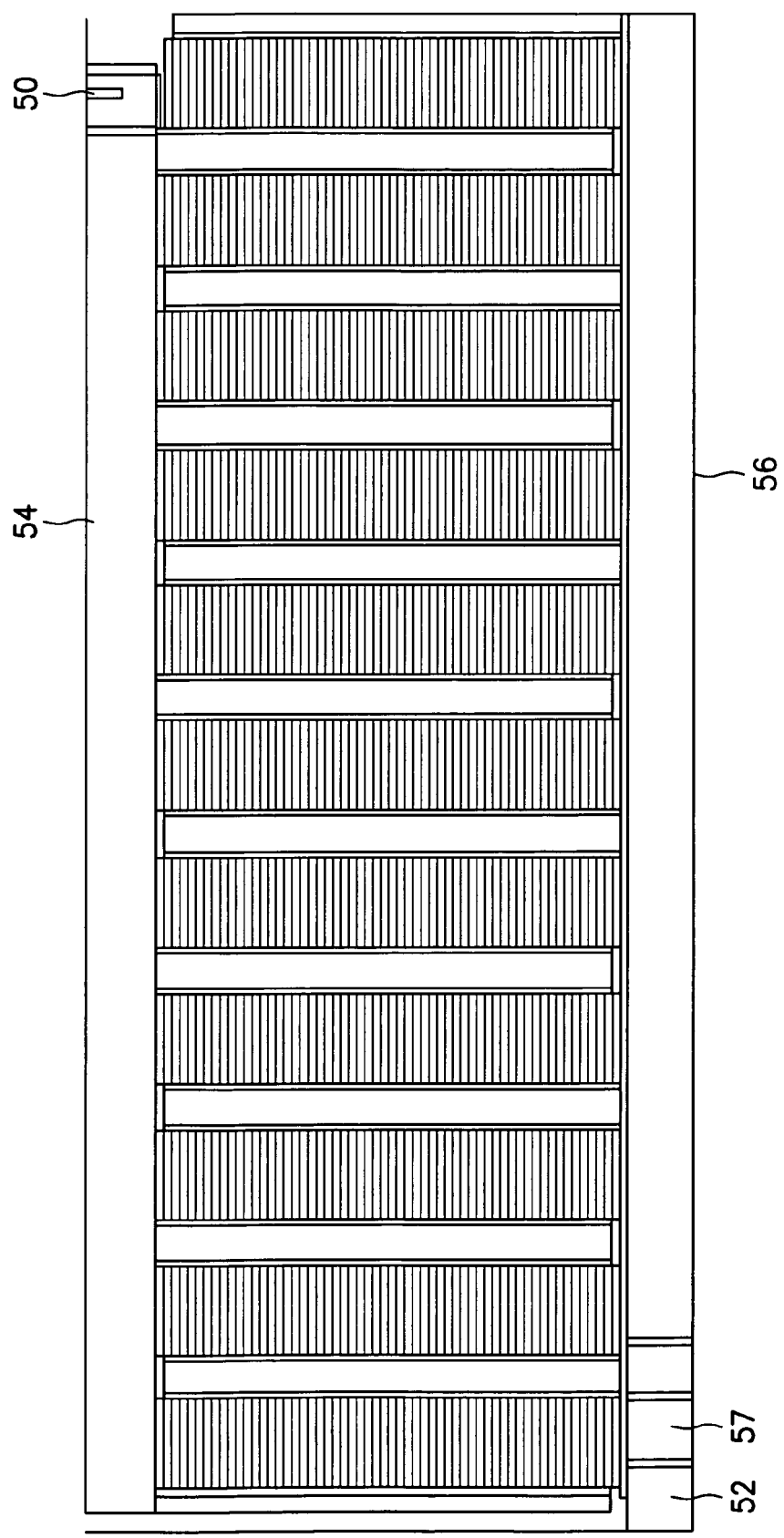
FIG. 19 is a top plan view of a variation of a dual gated bidirectional device according to the present invention.

Furthermore, a device according to the present invention can be modified to include other features. Referring, for example, to FIG. 19, a bidirectional device according to the present invention may include a current sense pad 57 which is electrically connected to the channel to detect the amount of current crossing the channel.

It should be noted that in the device fabricated through the method illustrated by FIGS. 9-18, gate electrode 27 is insulated from the AlGaN layer by an SiN insulation layer. A device according to the present invention may be formed with a gate electrode that forms schottky or ohmic contact with the AlGaN layer without deviating from the present invention.

Although the present invention has been described in relation to particular embodiments thereof, many other variations and modifications and other uses will become apparent to those skilled in the art. It is preferred, therefore, that the present invention be limited not by the specific disclosure herein, but only by the appended claims.

What is claimed is:

1. A bidirectional semiconductor switch comprising:
   a substrate;
   a first semiconductor body composed of one III-nitride semiconductor material;
   a second semiconductor body formed over said first semiconductor body and composed of another III-nitride semiconductor material, having a band gap that is different from that of said first III-nitride semiconductor material;
   a first ohmic electrode formed on and ohmically connected to a first portion of said second semiconductor body;
   a second ohmic electrode formed on and ohmically connected to a second portion of said second semiconductor body;
   a first gate electrode surrounding said first ohmic electrode;
   a second gate electrode surrounding said second ohmic electrode, wherein said gate electrodes are positioned such that said device exhibits a symmetric voltage blocking capability;
   a first gate runner coupled to said first gate electrode; and
   a second gate runner coupled to said second gate electrode.

2. A semiconductor switch according to claim 1, wherein said first semiconductor body is comprised of GaN and said second semiconductor body is comprised of AlGaN.

3. A semiconductor switch according to claim 1, wherein said gate electrodes make a schottky contact with said second semiconductor body.

4. A semiconductor switch according to claim 1, wherein said gate electrodes are comprised of either titanium, gold, aluminum, silver, chromium, tungsten, and indium.

5. A semiconductor switch according to claim 1, wherein said ohmic electrodes are comprised of either gold, silver, aluminum, or indium.

6. A semiconductor switch according to claim 1, further comprising a recess formed in said second semiconductor body, wherein at least one of said gate electrodes resides in said recess.

7. A semiconductor switch according to claim 1, further comprising a first recess and a second recess formed in said second semiconductor body, wherein said first gate electrode resides in said first recess and said second gate electrode resides in said second recess.

8. A semiconductor switch according to claim 1, wherein said first gate electrode and said second gate electrode are independently operable.

9. A semiconductor switch according to claim 1, wherein said first gate electrode is spaced a first distance from said first ohmic electrode and said second gate electrode is spaced a second distance from said second ohmic electrode, said first distance and said second distance being equal.

10. A semiconductor switch according to claim 1, wherein said substrate is comprised of either silicon, SiC, or sapphire.

11. A semiconductor switch according to claim 1, wherein said at least one of said gate electrodes is insulated from said second semiconductor body by a gate insulation body.

12. A semiconductor switch according to claim 1, wherein at least one of said gate electrodes make a schottky contact with said second semiconductor body.

13. A semiconductor switch according to claim 1, wherein said first gate runner is parallel to said second gate runner.

* * * * *